(12) United States Patent
Chun et al.

(10) Patent No.: US 6,710,542 B2
(45) Date of Patent: Mar. 23, 2004

(54) ORGANIC LIGHT EMITTING DEVICE WITH IMPROVED MOISTURE SEAL

(75) Inventors: Tan Boon Chun, Penang (MY); Oon Su Lin, Penang (MY); Daniel B. Roitman, Menlo Park, CA (US); Karen L. Seaward, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/212,638

(22) Filed: Aug. 3, 2002

(65) Prior Publication Data

US 2004/0021416 A1 Feb. 5, 2004

(51) Int. Cl.[7] ............................................... H05B 33/04
(52) U.S. Cl. ..................... 313/506; 313/512; 428/917
(58) Field of Search ................. 313/506, 512, 313/509; 428/917; 315/169.3

(56) References Cited

U.S. PATENT DOCUMENTS 5,491,377 A * 2/1996 Janusauskas ................ 313/506
6,049,167 A * 4/2000 Onitsuka et al. ............. 313/512
6,210,815 B1 * 4/2001 Ooishi ......................... 428/690
6,462,470 B1 * 10/2002 Ootsuki et al. .............. 313/504
2002/0043934 A1 * 4/2002 Tanaka ........................ 313/512

* cited by examiner

Primary Examiner—Ashok Patel

(57) ABSTRACT

An electroluminescent device and method for making the same. The electroluminescent device includes a substrate that is impermeable to water and oxygen having a first electrode thereon. An electroluminescent layer is in electrical contact with the first electrode, and a second electrode is in electrical contact with the electroluminescent layer. A seal having layers of epoxy and alternating with layers of SiNH prevents water and oxygen from reaching the second electrode. The epoxy preferably has a cure temperature less than 140° C. Similarly, the silicon nitride layer is preferably deposited at a temperature below 140° C. The layer of SiNH preferably has an etch rate of less than 50 A/sec in 10% HF solution.

7 Claims, 3 Drawing Sheets

ORGANIC LIGHT EMITTING DEVICE WITH IMPROVED MOISTURE SEAL

FIELD OF THE INVENTION

The present invention relates to electroluminescent devices, and more particularly, to an improved method for sealing an organic light emitting display to increase the lifetime of the display.

BACKGROUND OF THE INVENTION

Organic light emitting devices (OLEDs) are emissive displays consisting of a transparent substrate coated with a transparent conducting material, such as Indium Tin oxide (ITO), one or more organic layers, and a cathode made by evaporating or sputtering a metal of low work function characteristics, such as Ca or Mg. The organic layers are chosen so as to provide charge injection and transport from both electrodes into the electroluminescent organic layer (EL) where the charges recombine, emitting light. There may be one or more organic hole transport layers (HTL) between the ITO and the EL, as well as one or more electron injection and transporting layers between the cathode and the EL.

OLEDs hold out the promise of providing inexpensive displays. To function over extended periods of time, an OLED must be sealed to prevent water and oxygen from reaching the cathode and polymer layers. The low work function cathode metals are easily oxidized upon exposure to moisture and oxygen. Once oxidized, the cathode metal can no longer function as a charge injector. Hence, the light output of the OLED drops due to higher resistance and lower electron injection efficiency.

One method for improving the moisture resistance of an OLED involves adding a layer of a more stable metal, such as aluminum, on top of the low work function cathode to provide a moisture barrier. Unfortunately, such barriers do not provide sufficient protection.

A second prior art method for preventing moisture damage utilizes a package with a back cover made of either metal or glass. The back cover is typically glued to the substrate on which the OLED is fabricated using an epoxy adhesive. Unfortunately, epoxy adhesives do not provide sufficient moisture protection. Hence, to further prevent moisture from attacking the cathode metals, a moisture getter is sandwiched between the substrate and back cover. The moisture getter absorbs the moisture that passes through the epoxy adhesive before the moisture can reach the cathode metal. The moisture getter has two problems. First, the moisture getter has a saturation point where it will no longer be effective. Hence, the getter only protects the OLED for some period of time. Second, the absorbed moisture in the getter may be released when the package is heated up, resulting in cathode metal oxidation.

Another method for providing a moisture barrier for use in flexible OLEDs is taught in U.S. Pat. No. 6,146,225. In this method the flexible substrates are coated with a moisture barrier consisting of a repetition of polymer layer sandwiched between inorganic dielectric (nitride or oxide) layers. This approach requires the generation of a very smooth polymer layer on which the dielectric is deposited. If the polymer layer has imperfections, then the inorganic layer will develop pinholes, and the high level isolation observed with layers of this type is substantially reduced.

Broadly, it is the object of this invention to provide an improved sealing system for OLEDs and similar structures.

This and other objects of the invention will become apparent from the following detailed description of the invention and the accompanying drawings.

SUMMARY OF THE INVENTION

The present invention is an electroluminescent device and method for making the same. The electroluminescent device includes a substrate that is impermeable to water and oxygen having a first electrode thereon. An electroluminescent layer is in electrical contact with the first electrode, and a second electrode is in electrical contact with the electroluminescent layer. A seal having a layer of epoxy and a layer of silicon nitride prevents water and oxygen from reaching the second electrode. The epoxy preferably has a cure temperature less than 140° C. Similarly, the SiNH layer is preferably deposited at a temperature below 140° C. The layer of SiNH preferably has an etch rate of less than 50 A/sec in 10% HF solution.

DETAILED DESCRIPTION OF THE PREFERRED EMBODIMENTS OF THE INVENTION

Figure 1:
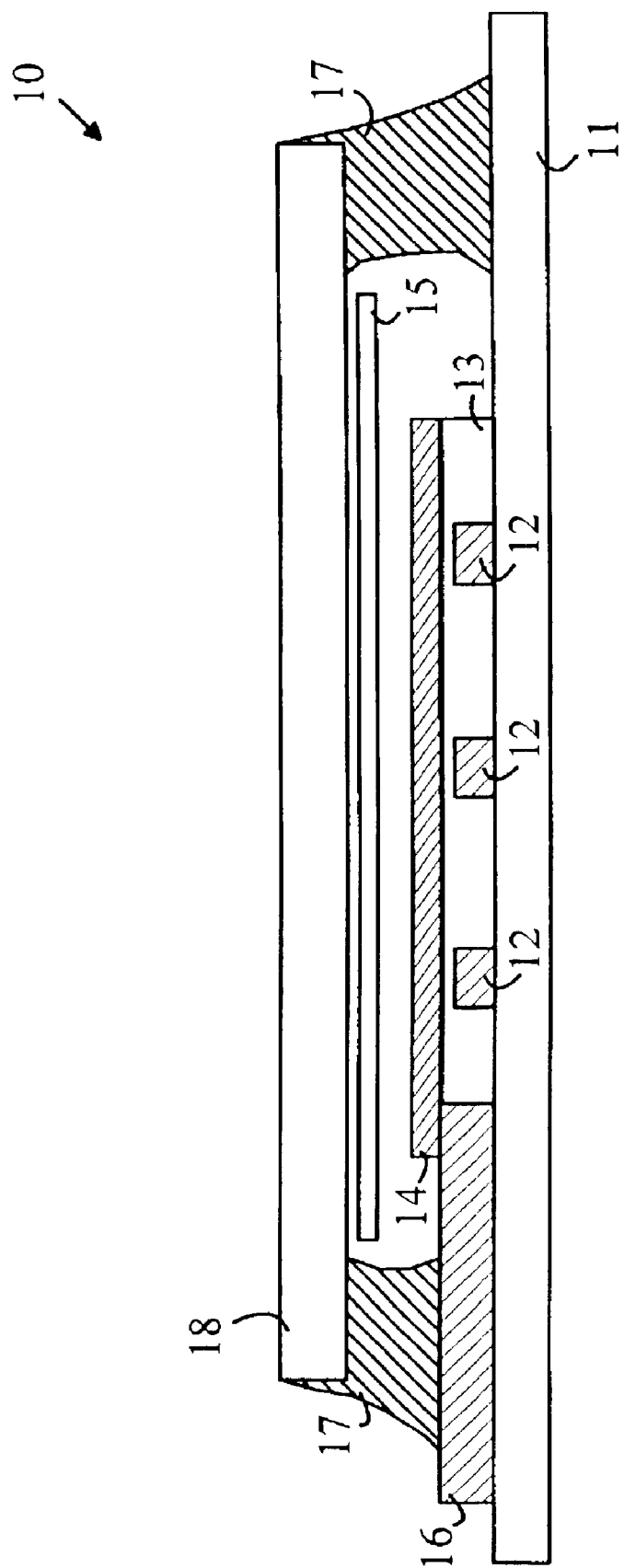
FIG. 1 is a cross-sectional view of a prior art OLED 10.

The manner in which the present invention provides its advantages can be more easily understood with reference to FIG. 1, which is a cross-sectional view of a prior art OLED 10. OLED 10 is a pixelated display in which each pixel is addressed by placing a potential difference across a corresponding row and column electrode. The cross-sectional view shown in FIG. 1 is taken through one of the row electrodes. OLED 10 is constructed on a transparent substrate 11 on which a patterned layer 12 of a transparent conductive material such as indium tin oxide (ITO) has been deposited to form the column electrodes which act as the anodes of the pixels. One or more organic layers are deposited over the column electrodes. These layers are shown as a single layer 13 to simplify the drawings. These layers typically include an emissive layer that emits light when holes and electrons combine therein. The layers may also include hole transport layers and electron injection layers. Since these layers are well known in the art, these layers will not be discussed further here.

Next, the cathode layer 14 is deposited and patterned to provide the row electrodes. In general, the cathode layer is deposited by evaporating or sputtering a low work function metal such as Ca or Mg.

The cathode layer and the organic layers must be protected from both oxygen and moisture. The low work function cathode metals are easily oxidized with exposure to moisture and oxygen. Once oxidized, the cathode metal can no longer function as a charge injector, and the light output of the OLED drops due to higher resistance and lower electron injection efficiency.

To provide protection against moisture and oxygen, OLED 10 utilizes a glass cover plate 18 that is bonded to the substrate 11 by an epoxy seal 17. Electrodes 16 pass through the epoxy seal to provide access to the cathode electrodes. Unfortunately, the commercially available epoxy sealants are not sufficiently impermeable to oxygen and water. To improve the lifetime of these devices, a moisture getter 15 is sometimes incorporated in the device. However, as noted above, such getters do not sufficiently extend the lifetimes of such devices.

Figure 2:
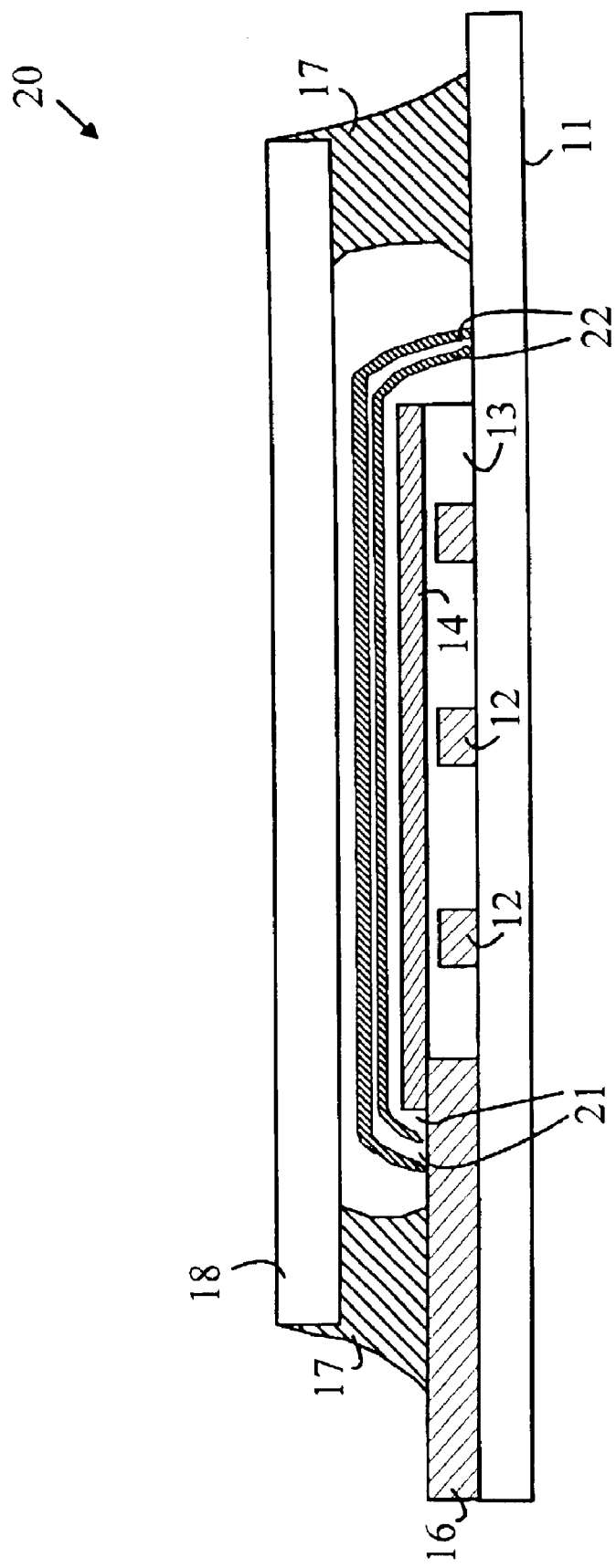
FIG. 2 is a cross-sectional view of an OLED 20 according to one embodiment of the present invention.

Refer now to FIG. 2, which is a cross-sectional view of an OLED 20 according to one embodiment of the present invention. To simplify the following discussion, those elements of OLED 20 that serve the same function as elements of OLED 10 discussed above have been given the same numeric designations and will not be discussed further here. OLED 20 utilizes a sealing layer comprising a combination of an inorganic layer of SiNH 22 and an epoxy planarization layer 21 to provide protection against oxygen and water. The sealing layer can include multiple layers, each consisting of an epoxy layer covered by a layer of SiNH. The SiNH layer provides the moisture and oxygen barrier. The epoxy layer provides a base layer for the thin SiNH layer.

While SiNH films are used in wafer fabrication, the deposition temperatures used in wafer fabrication are higher than the maximum temperatures that can be utilized in OLED fabrication. In wafer fabrication, the SiNH layers are deposited using plasma-enhanced chemical vapor deposition (PECVD) at a deposition temperature that is typically in the range of 300° C. to 400° C. Polymer LED devices utilize compounds based on polyfluorenes, which have a glass transition temperature around 120–135° C. If the OLED is heated above the glass transition temperature, the polymer thin film may undergo an undesirable relaxation. Accordingly, the SiNH layer must be deposited at temperatures below those normally used in semiconductor fabrication.

In principle, a low temperature SiNH film can be deposited in a variety of ways including PECVD, high-density plasma chemical vapor deposition, sputtering, and evaporation. In the preferred embodiment of the present invention, the PECVD method is utilized. In general, SiNH film properties deposited via PECVD depend on gas mixture, pressure, temperature, and rf-power and frequency.

Although the moisture barrier properties of these high deposition temperature SiNH films are known to the art, the moisture barrier properties are not very well understood at the molecular level. Accordingly, there is little guidance in the art with respect to optimizing the above-described parameters to provide a sufficient moisture barrier at low deposition temperatures. The present invention is based on the observation that SiNH films with a high packing density provide a better moisture barrier than films with a low packing density.

The packing density of the SiNH film can be inferred from a knowledge of the etch rate in dilute HF and index of refraction. SiNH films have a refractive index ranging from 1.7 to 2.3 depending on the silicon-to-nitrogen ratio and on the hydrogen content. For a given Si/N ratio, the etch rate in an HF solution is a rough measure of film packing density with low etch rate indicating high packing density. In the preferred embodiment of the present invention, the deposition conditions are optimized to provide an index of refraction between 1.8 and 2.0 and an etch rate in 10% HF solution of less than 50 Å/sec. This can be achieved with a suitable ratio of silane and nitrogen gases and adequate ion bombardment during film deposition. In general the deposition conditions depend on the particular reactor being utilized. For the particular reactor by the present inventors, the range of conditions is 500–1000 sccm 2% silane in argon, 1000–2000 sccm nitrogen, 700–1200 mTorr, 20–80 Watts, 100–130° C. However, other conditions may be utilized with other reactors.

In the present invention, the SiNH is deposited on an epoxy layer that is applied over the cathode layer. The epoxy layer can be applied by any conventional means. In the preferred embodiment of the present invention, the epoxy layer is applied by spin casting.

The epoxy is cured by heat, UV, or microwave irradiation, depending on the particular epoxy system being utilized.

In the preferred embodiment of the present invention, the epoxy layer is about 2 μm thick and comprises a clear epoxy-anhydride system with a glass transition around 140° C. The epoxy is cured at 125° C. for 2 hours. A Suitable epoxy compositions is PT5-42 from Pacific Polytech Incorporated in Novato, Calif. However, other thermosetting polymers that are crosslinkable at a temperature below 130° C. may be utilized. Polymers based on polyimides, polyesters, polyurethanes, or polyisocyanates can be utilized. For example, benzocyclobutene having a thickness of about 2 μm can be utilized. This material is used in wafer fabrication.

The above-described embodiments of the present invention utilize a sealing layer in which the epoxy and SiNH sealing layer encapsulates the cathode. However, embodiments in which the sealing layer is applied around the edge of a water and oxygen impermeable cover plate can also be practiced. Such embodiments reduce any chemical interaction between the cathode material and the epoxy layer. In addition, embodiments of this type provide additional thermal isolation for the OLED layers during the deposition process, and hence, allow somewhat higher temperatures to be utilized without damaging the OLED.

Figure 3:
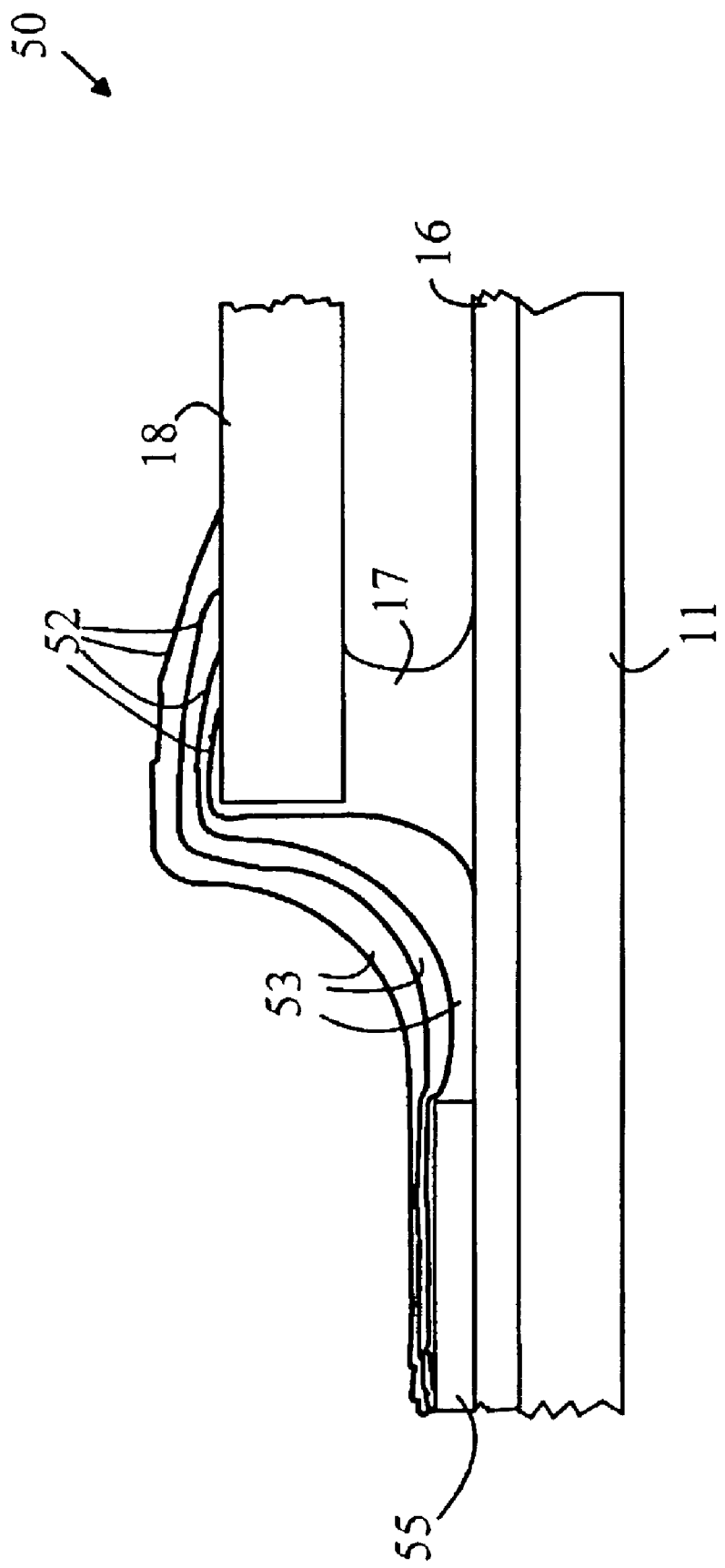
FIG. 3 is a cross-sectional view of the edge portion of an OLED 50 according to another embodiment of the present invention.

Refer now to FIG. 3, which is a cross-sectional view of the edge portion of an OLED 50 according to another embodiment of the present invention. To simplify the following discussion, those elements of OLED 50 that serve the same function as elements of OLED 20 discussed above have been given the same numeric designations and will not be discussed further here. In OLED 50, the sealing layer 51 is constructed from one or more bi-layers consisting of a layer of SiNH 52 deposited on a layer of epoxy 53 as discussed above. The sealing layer is applied over the top cover plate 18. A protective tape layer 55 is used to protect electrode 16 during the sealing process. Tape layer 55 is removed after the sealing process is completed.

In the embodiment shown in FIG. 3, the sealing layer is applied only around the edge of the cover plate 18. However, the scaling layer can be applied across the top of the cover plate as well, since the light generated by the OLED exits through the bottom of the device. Applying the material over the entire cover plate allows the layer to be spin cast.

Various modifications to the present invention will become apparent to those skilled in the art from the foregoing description and accompanying drawings. Accordingly, the present invention is to be limited solely by the scope of the following claims.

What is claimed is:

1. An electroluminescent device comprising:

a substrate that is impermeable to water and oxygen;

a first electrode deposited on said substrate;

an electroluminescent layer in electrical contact with said first electrode;

a second electrode in electrical contact with said electroluminescent layer; and a seal for preventing water and oxygen from reaching said second electrode, said seal comprising a layer of silicon nitride on a layer of epoxy.

2. The electroluminescent device of claim 1 wherein said layer of epoxy covers said second electrode.

3. The electroluminescent device of claim 1 wherein said seal further comprises a water and oxygen impermeable plate.

4. The electroluminescent device of claim 1 wherein said epoxy has a cure temperature less than 140° C.

5. The electroluminescent device of claim 1 wherein said epoxy comprises an epoxy-anhydride.

6. The electroluminescent device of claim 1 wherein said epoxy comprises benzocyclobutene.

7. The electroluminescent device of claim 1 wherein said layer of silicon nitride has an etch rate of less than 50 A/sec in 10% HF solution.

* * * * *